United States Patent
Ramani et al.

(10) Patent No.: US 8,836,002 B2
(45) Date of Patent: Sep. 16, 2014

(54) METHOD FOR FABRICATING A DRAM CAPACITOR

(71) Applicants: Intermolecular, Inc., San Jose, CA (US); Elpida Memory, Inc, Tokyo (JP)

(72) Inventors: Karthik Ramani, Santa Clara, CA (US); Hanhong Chen, Milpitas, CA (US); Wim Deweerd, San Jose, CA (US); Nobumichi Fuchigami, Sunnyvale, CA (US); Hiroyuki Ode, Higashihiroshima (JP)

(73) Assignee: Intermolecular, Inc., San Jose, CA (US)

(*) Notice: Subject to any disclaimer, the term of this patent is extended or adjusted under 35 U.S.C. 154(b) by 0 days.

(21) Appl. No.: 13/738,794

(22) Filed: Jan. 10, 2013

(65) Prior Publication Data
US 2013/0154057 A1  Jun. 20, 2013

Related U.S. Application Data

(63) Continuation of application No. 13/084,666, filed on Apr. 12, 2011.

(51) Int. Cl.
| | | |
|---|---|---|
| *H01L 27/108* | (2006.01) | |
| *H01L 29/94* | (2006.01) | |
| *H01G 4/12* | (2006.01) | |
| *H01G 4/33* | (2006.01) | |
| *H01L 49/02* | (2006.01) | |

(52) U.S. Cl.
CPC .............. *H01L 28/40* (2013.01); *H01G 4/1218* (2013.01); *H01G 4/33* (2013.01); *H01L 28/75* (2013.01); *H01L 28/60* (2013.01)
USPC .......................... 257/296; 257/306; 257/310

(58) Field of Classification Search
USPC ........................................ 257/296, 306, 310
See application file for complete search history.

(56) References Cited

U.S. PATENT DOCUMENTS

| | | | | |
|---|---|---|---|---|
| 4,542,083 | A * | 9/1985 | Cava et al. ................. | 429/231.5 |
| 4,912,934 | A * | 4/1990 | Itoh et al. ......................... | 62/112 |
| 5,125,965 | A * | 6/1992 | Sebenik .......................... | 75/392 |
| 7,754,185 | B2* | 7/2010 | McHugh et al. ............... | 423/606 |
| 8,354,702 | B1* | 1/2013 | Shanker et al. ............... | 257/296 |
| 2006/0073706 | A1* | 4/2006 | Li et al. ......................... | 438/710 |
| 2006/0165572 | A1* | 7/2006 | McHugh et al. ................ | 423/54 |
| 2008/0124613 | A1* | 5/2008 | Gur et al. ......................... | 429/44 |
| 2010/0282300 | A1* | 11/2010 | Auvray et al. ................ | 136/252 |
| 2011/0084229 | A1* | 4/2011 | Kawakami et al. ........ | 252/182.1 |

\* cited by examiner

*Primary Examiner* — Charles Garber
*Assistant Examiner* — Ron Pompey (57) ABSTRACT

A method for fabricating a dynamic random access memory (DRAM) capacitor stack is disclosed wherein the stack includes a first electrode, a dielectric layer, and a second electrode. The first electrode is formed from a conductive binary metal compound and the conductive binary metal compound is annealed in a reducing atmosphere to promote the formation of a desired crystal structure. The binary metal compound may be a metal oxide. Annealing the metal oxide (i.e. molybdenum oxide) in a reducing atmosphere may result in the formation of a first electrode material (i.e. $MoO_2$) with a rutile-phase crystal structure. This facilitates the formation of the rutile-phase crystal structure when $TiO_2$ is used as the dielectric layer. The rutile-phase of $TiO_2$ has a higher k value than the other possible crystal structures of $TiO_2$ resulting in improved performance of the DRAM capacitor.

9 Claims, 7 Drawing Sheets

METHOD FOR FABRICATING A DRAM CAPACITOR

CROSS-REFERENCE TO RELATED APPLICATIONS

This is a Continuation Application of U.S. patent application Ser. No. 13/084,666, filed on Apr. 12, 2011, which is herein incorporated by reference for all purposes.

This document relates to the subject matter of a joint research agreement between Intermolecular, Inc. and Elpida Memory, Inc.

FIELD OF THE INVENTION

The present invention generally relates to the field of dynamic random access memory (DRAM), and more particularly to electrode processing for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance of is given by:

$$C = \kappa \varepsilon_o \frac{A}{d} \quad \text{(Eqn. 1)}$$

where $\varepsilon_o$ represents the vacuum permittivity. The dielectric constant is a measure of a material's polarizability. Therefore, the higher the dielectric constant of a material, the more charge the capacitor can hold. Therefore, if the k-value of the dielectric is increased, the area of the capacitor can be decreased and maintain the desired cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The leakage current in DRAM capacitors is largely due to mechanisms such as thermally induced charge flow, defects, and tunneling. The leakage current increases exponentially as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium dioxide (TiO$_2$) is one metal oxide dielectric material which displays significant promise in terms of serving as a high-k dielectric material for implementation in DRAM capacitors.

The dielectric constant of a dielectric material may be dependent upon the crystalline phase(s) of the material. For example, in the case of TiO$_2$, the anatase crystalline phase of TiO$_2$ has a dielectric constant of approximately 40, while the rutile crystalline phase of TiO$_2$ can have a dielectric constant of approximately >80. Due to the higher-k value of the rutile-phase, it is desirable to produce TiO$_2$ based DRAM capacitors with the TiO$_2$ in the rutile-phase. The relative amounts of the anatase phase and the rutile phase can be determined from x-ray diffraction (XRD). From Eqn. 1 above, a TiO$_2$ layer in the rutile-phase could be physically thicker and maintain the desired capacitance. The increased physical thickness is important for lowering the leakage current of the capacitor. The anatase phase will transition to the rutile phase at high temperatures (>800 C). However, high temperature processes are undesirable in the manufacture of DRAM devices.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Therefore, there is a need to develop a DRAM electrode which promotes the growth of the rutile-phase in a $TiO_2$ dielectric layer during formation of the dielectric layer. Such a DRAM electrode would enable a DRAM capacitor with high cell capacitance, small area, low leakage current, and fast device speed.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ is conductive and has shown great promise as an electrode material in DRAM capacitors. $MoO_2$ has a distorted rutile crystal structure and can serve as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) of $MoO_2$ degrade the performance of the $MoO_2$ electrode because they act more like insulators and have crystal structures that do not promote the deposition of the rutile-phase of $TiO_2$. For example, $MoO_3$ (the most oxygen-rich phase) is a dielectric material and has an orthorhombic crystal structure.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. The $MoO_{2+x}$ phases may form during the deposition of the electrode and may not be evenly distributed throughout the layer thickness. The $MoO_2$ electrode material may be deposited using any common deposition technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Typically, the $MoO_2$ electrode material must be annealed after deposition to fully crystallize the film. Even if the anneal is performed under an inert gas such as nitrogen, the presence of $MoO_{2+x}$ phases are observed and the effective k-value of the $TiO_2$ dielectric subsequently deposited on such an electrode is lower than desired.

Therefore, there is a need to develop an electrode system that maximizes the presence of crystalline $MoO_2$ and promotes the growth of the rutile-phase in a subsequently deposited $TiO_2$ dielectric layer, while simultaneously providing the high work function and manufacturability characteristics required for next generation DRAM capacitors.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION OF THE INVENTION

It is to be understood that both the foregoing general description and the following detailed description are exemplary and explanatory only and are not restrictive of the invention as claimed. The accompanying drawings, which are incorporated in and constitute a part of the specification, illustrate embodiments of the invention and together with the general description, serve to illustrate the principles of the invention. Reference will now be made in detail to the subject matter disclosed, which is illustrated in the accompanying drawings.

Figure 1:
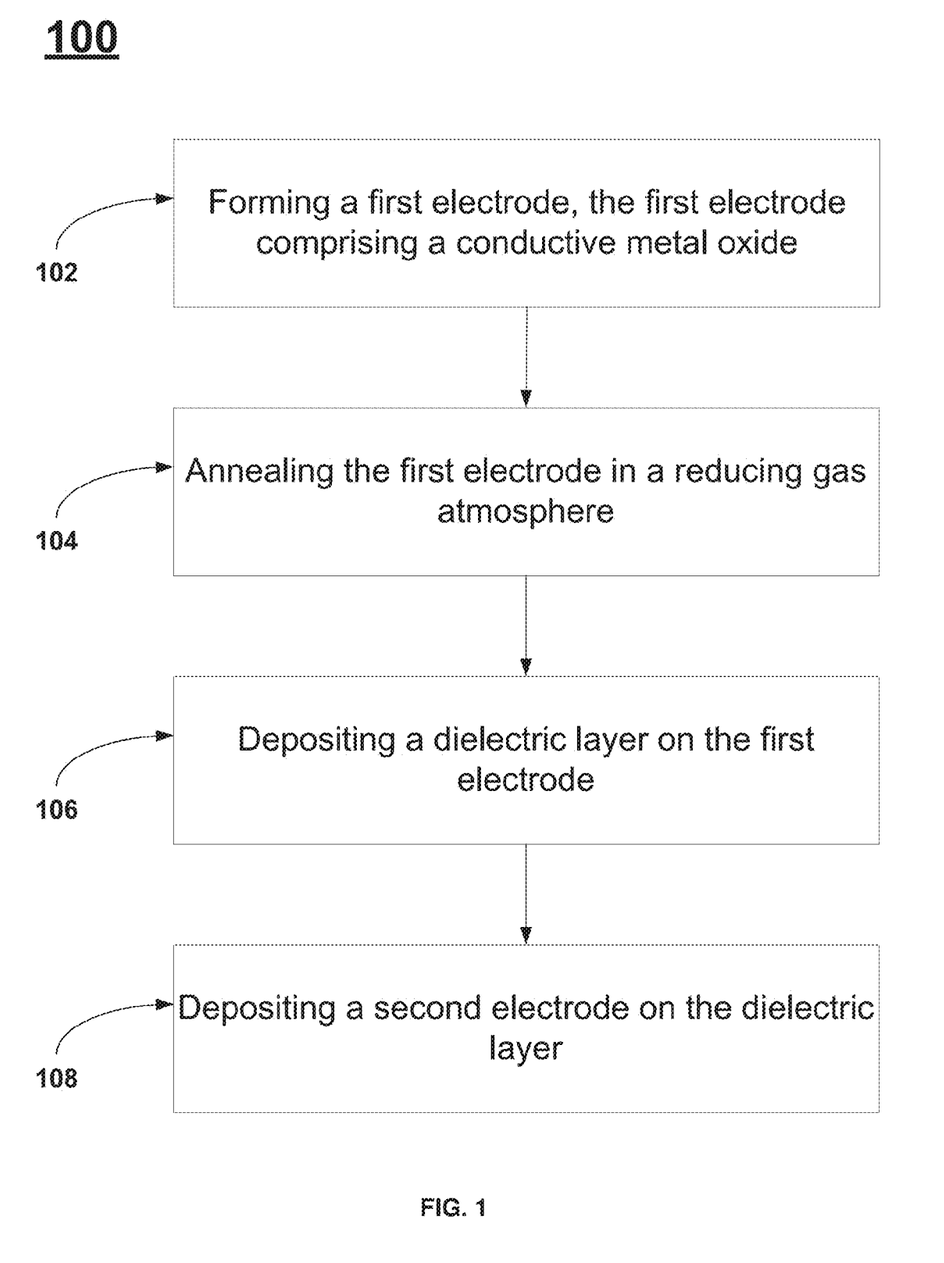
FIG. 1 illustrates a flow chart illustrating a method for fabricating a DRAM capacitor stack, in accordance with some embodiments of the present invention.

FIG. 1 describes a method, 100, for fabricating a DRAM capacitor stack. The initial step, 102, comprises forming a first electrode layer. Examples of suitable electrode materials comprise conductive metal oxides, conductive metal silicides, conductive metal nitrides, and combinations thereof. A particularly interesting class of materials is the conductive metal oxides. Generally, deposited thin films of these conductive metal oxide materials also contain oxygen-rich components. The next step, 104, comprises annealing the first electrode layer in a reducing atmosphere and decreasing the concentration of the oxygen-rich components. As used herein, a reducing atmosphere is one where oxidation of the electrode is prevented by the presence of gases such as $H_2$ and $NH_3$ as a mixture in an inert gas such as $N_2$ or Ar, etc. Furthermore, surplus oxygen in the metal oxide materials can be removed through reaction with the reducing atmosphere. The annealing in the reducing atmosphere may utilize either thermal energy or plasma energy to activate the reducing atmosphere. The next step, 106, comprises forming a dielectric material on the annealed first electrode layer. Optionally, the dielectric material may undergo a post dielectric anneal (PDA) treatment. The next step, 108, comprises forming a second electrode layer on the dielectric layer. Optionally, the DRAM capacitor stack may undergo a post metallization anneal (PMA) treatment. Examples of the PDA and PMA treatments are further described in U.S. patent application Ser. No. 13/159,842, filed Jun. 14, 2011, which is herein incorporated by reference.

Those skilled in the art will appreciate that each of the first electrode layer, the dielectric layer, and the second electrode layer may be formed using well known techniques such as ALD, PE-ALD, AVD, UV-ALD, CVD, PECVD, or PVD. Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

In FIGS. 2, 3, 5 and 6 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 2:
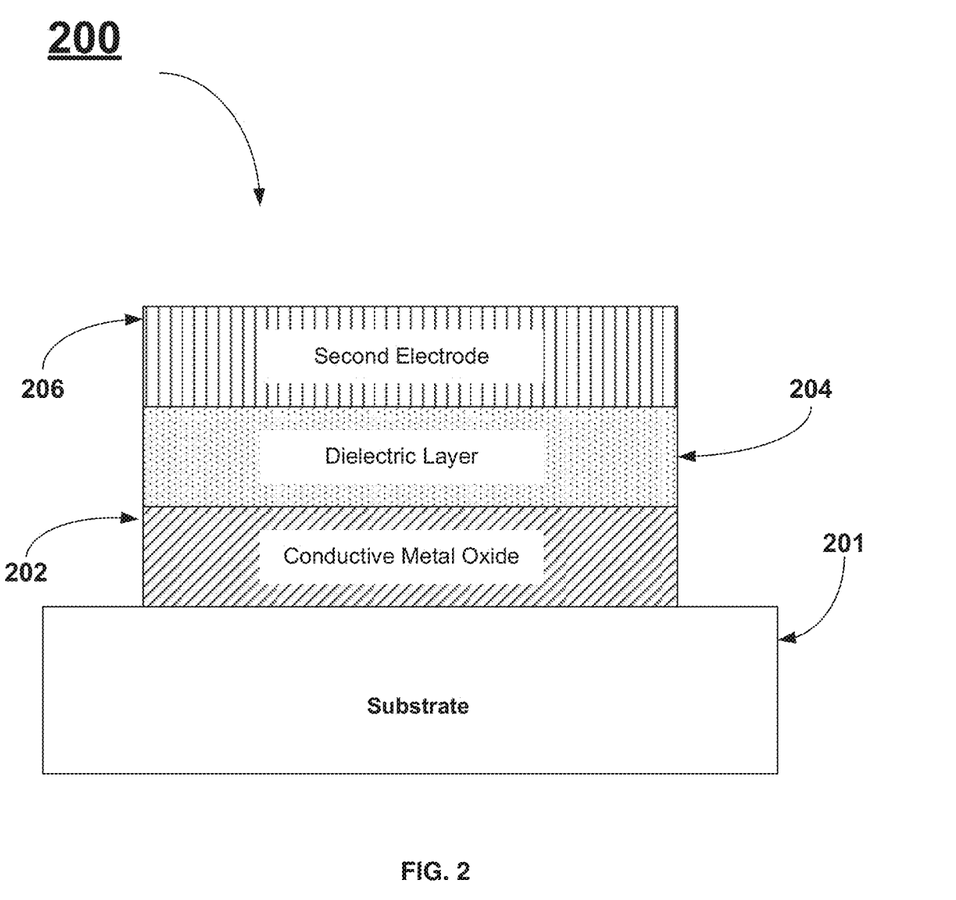
FIG. 2 illustrates a simplified cross-sectional view of a DRAM capacitor stack fabricated in accordance with some embodiments of the present invention.

FIG. 2 illustrates a simple capacitor stack, 200, consistent with some embodiments of the present invention. Using the method as outlined in FIG. 1 and described above, first electrode layer, 202, is formed on substrate, 201. Generally, the substrate has already received several processing steps in the manufacture of a full DRAM device. First electrode layer, 202, comprises a conductive metal oxide material that also contains oxygen-rich components. Examples of the conductive metal oxides include the conductive compounds of molybdenum oxide, tungsten oxide, ruthenium oxide, rhenium oxide, chromium oxide, rhodium oxide, iridium oxide, manganese oxide, tin oxide, cobalt oxide, or nickel oxide.

In the next step, the substrate with first electrode layer, 202, would then be annealed in a reducing atmosphere to reduce the concentration of the oxygen-rich components. Generally, the reducing atmosphere will comprise $H_2$, or $NH_3$ mixed with an inert gas. A specific example of a reducing atmosphere that is available commercially is forming gas wherein the $H_2$ concentration can range between about 1 and 25% mixed with $N_2$. The annealing in the reducing atmosphere may utilize either thermal energy or plasma energy to activate the reducing atmosphere. Alternatively, the first electrode layer may be annealed using a Rapid Thermal Annealing (RTA) technique wherein the temperature is quickly raised in the presence of a nitrogen containing gas such as $N_2$, forming gas, $NH_3$, etc.

In the next step, dielectric layer, 204, would then be formed on the annealed first electrode layer, 202. A wide variety of dielectric materials have been targeted for use in DRAM capacitors. Examples of suitable dielectric materials comprise $SiO_2$, $SiO_2/Si_xN_y$, SiON, $Al_2O_3$, $HfO_2$, $HfSiO_x$, $ZrO_2$, $Ta_2O_5$, $TiO_2$, $SrTiO_3$ (STO), $SrBaTiO_x$ (SBT), $PbZrTiO_x$ (PZT) or doped versions of the same such as $Al:TiO_2$. These dielectric materials may be formed as a single layer or may be formed as a hybrid or nanolaminate structure. A specific dielectric material of interest is the rutile-phase of $TiO_2$.

In the next step, the second electrode layer, 206, is formed on dielectric layer, 204. The second electrode layer may be a conductive binary metal compound material as described above, a metal, or a combination thereof. The remaining full DRAM device (not shown) would then be manufactured using well known techniques. Optionally, the DRAM capacitor stack may now receive a PMA treatment.

Figure 3:
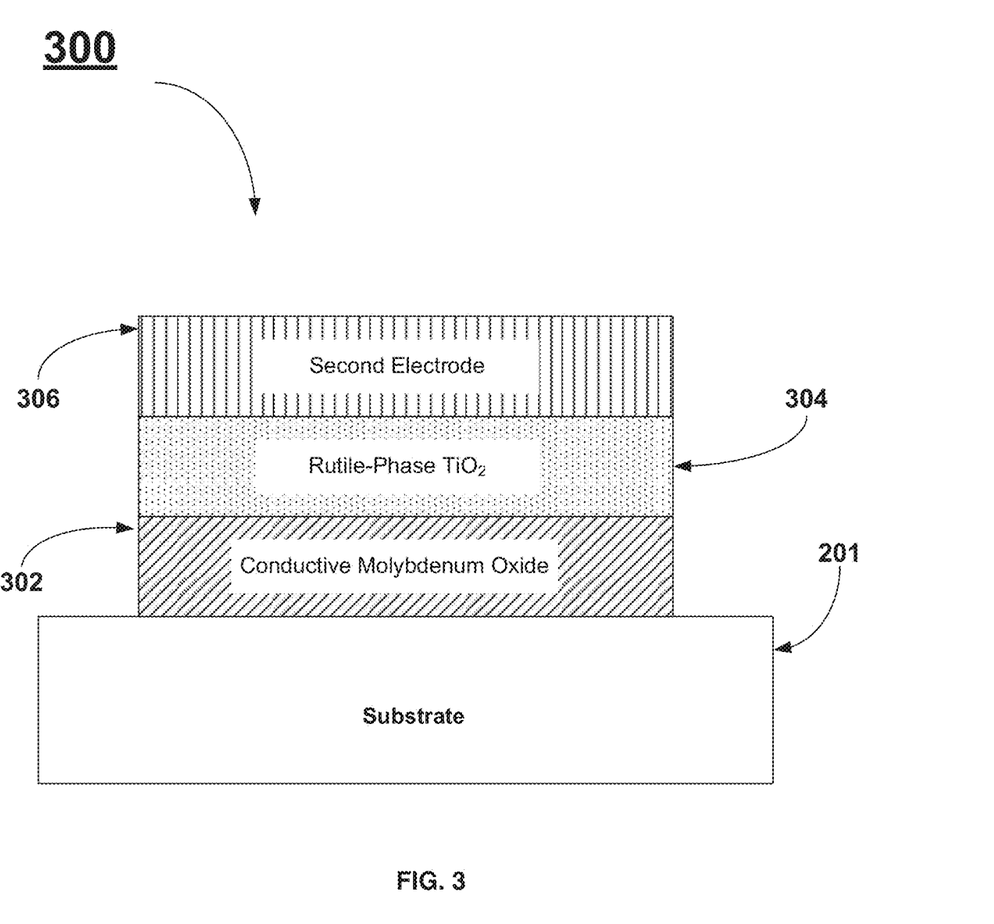
FIG. 3 illustrates a simplified cross-sectional view of a DRAM capacitor stack fabricated in accordance with some embodiments of the present invention.

FIG. 3 illustrates a specific example of a simple capacitor stack, 300, consistent with some embodiments of the present invention. Using the method as outlined in FIG. 1 and described above, first electrode layer, 302, is formed on substrate, 201. Generally, the substrate has already received several processing steps in the manufacture of a full DRAM device. First electrode layer, 302, comprises a $MoO_2$ material that also contains oxygen-rich components ($MoO_{2+x}$). The goal is to maximize the amount of $MoO_2$ present in first electrode layer, 302, because it has a distorted rutile crystal structure and would serve as a good template to promote the growth of rutile-phase of a $TiO_2$ dielectric material in a later deposition step. The presence of oxygen-rich materials ($MoO_{2+x}$) is to be minimized because they generally do not promote the growth of the rutile-phase crystal structure of the $TiO_2$ dielectric material.

In the next step, the substrate with first electrode layer, 302, comprising $MoO_2$ mixed with $MoO_{2+x}$ would then be annealed in a reducing atmosphere to reduce the concentration of the oxygen-rich components and increase the relative amount of $MoO_2$ phases. Generally, the reducing atmosphere will comprise $H_2$, or $NH_3$ mixed with an inert gas. A specific example of a reducing atmosphere that is available commercially is forming gas wherein the $H_2$ concentration can range between about 1 and 25% mixed with $N_2$. The annealing in the reducing atmosphere may utilize either thermal energy, plasma energy or RTA to activate the reducing atmosphere. The reducing atmosphere will crystallize the first electrode layer if there is an amorphous component and reduce the $MoO_{2+x}$ species to $MoO_2$. It is desirable that the crystalline $MoO_2$ phase account for ≥40% of the first electrode.

In some embodiments of the present invention, a forming gas having a $H_2$ concentration of between approximately 1 to 10% when introduced at annealing temperatures between approximately 400 to 650° C. for a process time of 1 minute to several hours displays the chemical reducing properties required to reduce the concentration of oxygen-rich molybdenum oxides present in the first electrode, 302.

Figure 4:
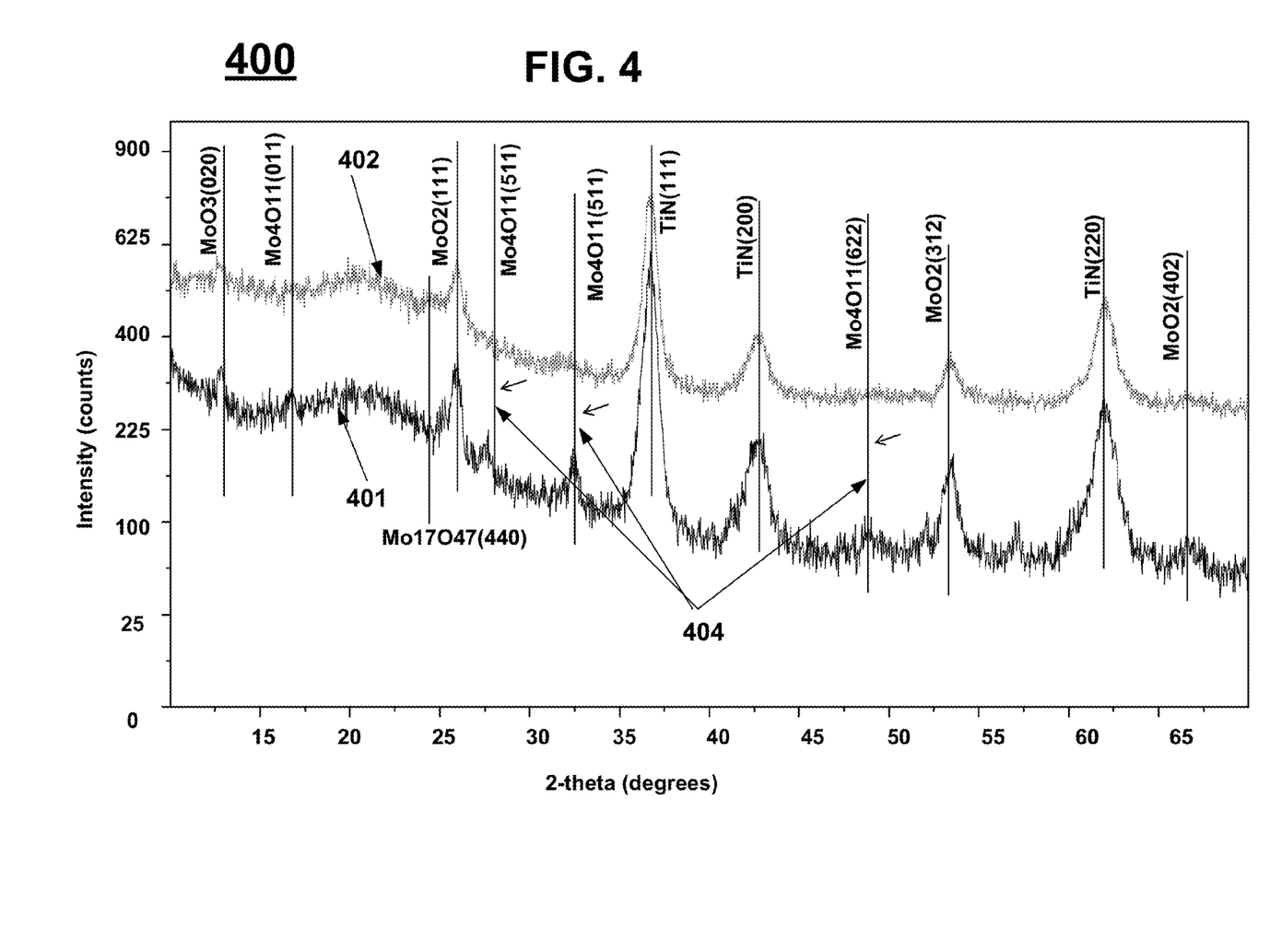
FIG. 4 presents x-ray diffraction data illustrating the crystallographic effects of a thermal reducing gas treatment on oxygen-rich phases of a molybdenum oxide material.

In some embodiments of the present invention, annealing an as-deposited layer of molybdenum oxide in the presence of a $N_2$ and $H_2$ forming gas has a marked impact on the layer's crystal structure. FIG. 4 presents x-ray diffraction data illustrating the crystallographic effects of a thermal reducing gas treatment on oxygen-rich phases of a molybdenum oxide material. FIG. 4 illustrates an x-ray diffraction (XRD) study of a molybdenum oxide electrode material. Data set 401 illustrates the XRD data prior to the forming gas/annealing treatment, while data set 402 illustrates XRD data taken after the forming gas/annealing treatment. As evident in the XRD data taken prior to annealing, 401, the oxygen-rich phases $MoO_{2+x}$ are marked by the XRD peaks, 404, indicative of the Bragg reflections associated with the $MoO_{2+x}$ phases. Upon annealing in a $H_2$—$N_2$ forming gas, the Bragg reflections, 404, associated with the $MoO_{2+x}$ phases disappear, leaving only the XRD peaks associated with the Bragg reflections of the crystallized $MoO_2$ phase as indicated in data set 402.

Returning to FIG. 3, in the next step, dielectric layer, 304, would then be formed on the annealed first electrode layer, 302. In this example, a layer of $TiO_2$ that exists predominantly (>30%) in the rutile-phase is formed as the dielectric layer, 304. The rutile-phase of $TiO_2$ grows preferentially over the anatase-phase due to the distorted rutile-phase crystal structure of the underlying predominantly $MoO_2$ electrode material. The $TiO_2$ layer generally has a physical layer thickness between 5 nm and 20 nm and exhibits a k value of >40.

In the next step, the second electrode layer, 306, is formed on dielectric layer, 304. The second electrode layer may be a conductive binary metal compound material as described above, a metal, or a combination thereof. The remaining full DRAM device (not shown) would then be manufactured using well known techniques.

Figure 5:
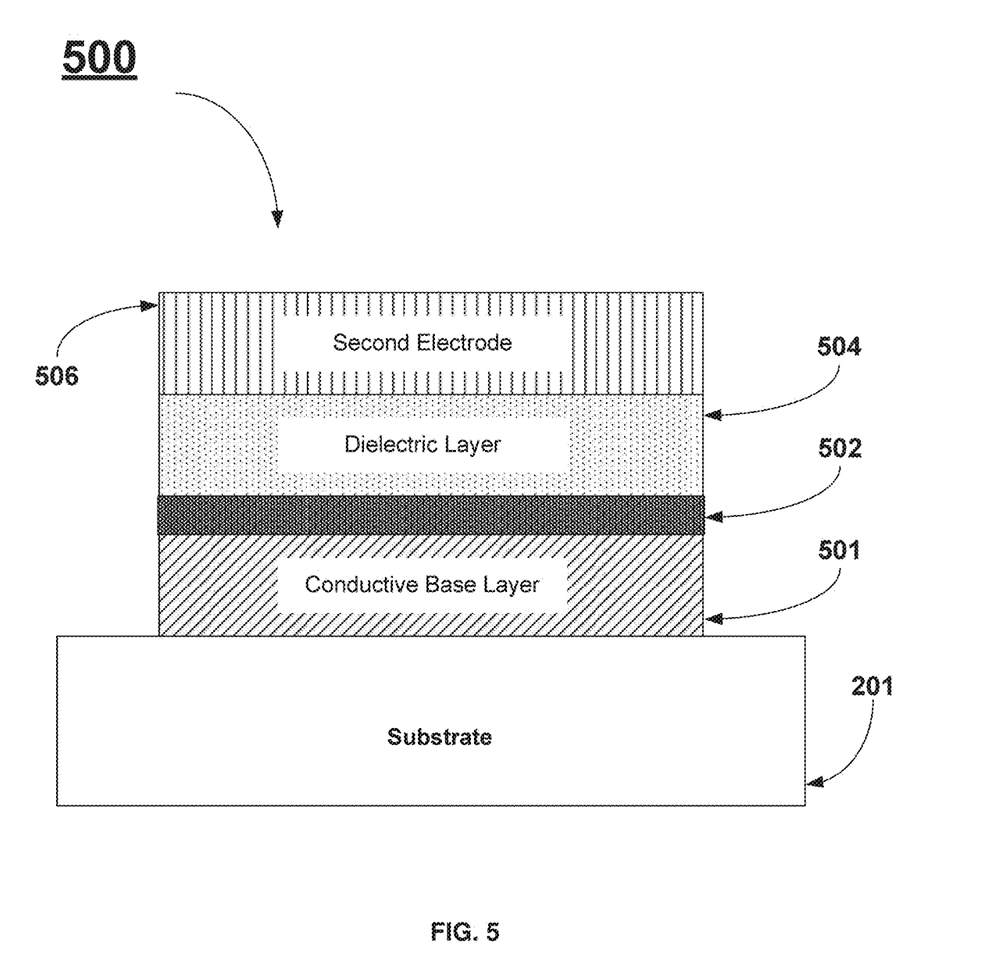
FIG. 5 illustrates a simplified cross-sectional view of a DRAM capacitor stack fabricated in accordance with some embodiments of the present invention.

FIG. 5 illustrates a simple capacitor stack, 500, consistent with some embodiments of the present invention. In this illustration, only a thin layer of the conductive binary metal compound is formed on top of a previously deposited conductive base layer, 501, to form the first electrode. The base layer may be a metal or highly conductive material such as TiN, TaN, TiAlN, Al, Cu, W, WN or the like. Using the method as outlined in FIG. 1 and described above, thin first electrode layer, 502, is deposited on base layer, 501. Generally, the substrate has already received several processing steps in the manufacture of a full DRAM device. In this example, thin first electrode layer, 502, comprises a conductive metal oxide material that also contains oxygen-rich components. Examples of the conductive metal oxides include molybdenum oxide, tungsten oxide, ruthenium oxide, rhenium oxide, chromium oxide, rhodium oxide, iridium oxide, manganese oxide, tin oxide, cobalt oxide, or nickel oxide.

In the next step, the substrate with base layer, 501, and thin first electrode layer, 502, would then be annealed in a reducing atmosphere to reduce the concentration of the oxygen-rich components. Generally, the reducing atmosphere will comprise $H_2$, or $NH_3$ mixed with an inert gas. A specific example of a reducing atmosphere that is available commercially is forming gas wherein the $H_2$ concentration can range between about 1 and 25% mixed with $N_2$. The annealing in the reducing atmosphere may utilize thermal energy, plasma energy, or RTA to activate the reducing atmosphere.

In the next step, dielectric layer, 504, would then be formed on the annealed base layer, 501, and thin first electrode layer, 502. A wide variety of dielectric materials have been targeted for use in DRAM capacitors. Examples of suitable dielectric materials comprise $SiO_2$, $SiO_2/Si_xN_y$, SiON, $HfO_2$, $ZrO_2$, $Ta_2O_5$, $TiO_2$, $SrTiO_3$ (STO), $SrBaTiO_x$ (SBT), $PbZrTiO_x$ (PZT) or doped versions of the same such as $Al:TiO_2$. These dielectric materials may be formed as a single layer or may be formed as a hybrid or nanolaminate structure. Optionally, the dielectric layer may now receive a PDA treatment.

In the next step, the second electrode layer, 506, is formed on dielectric layer, 504. The second electrode layer may be a binary metal compound material as described above, a metal, or a combination thereof. The remaining full DRAM device (not shown) would then be manufactured using well known techniques.

Figure 6:
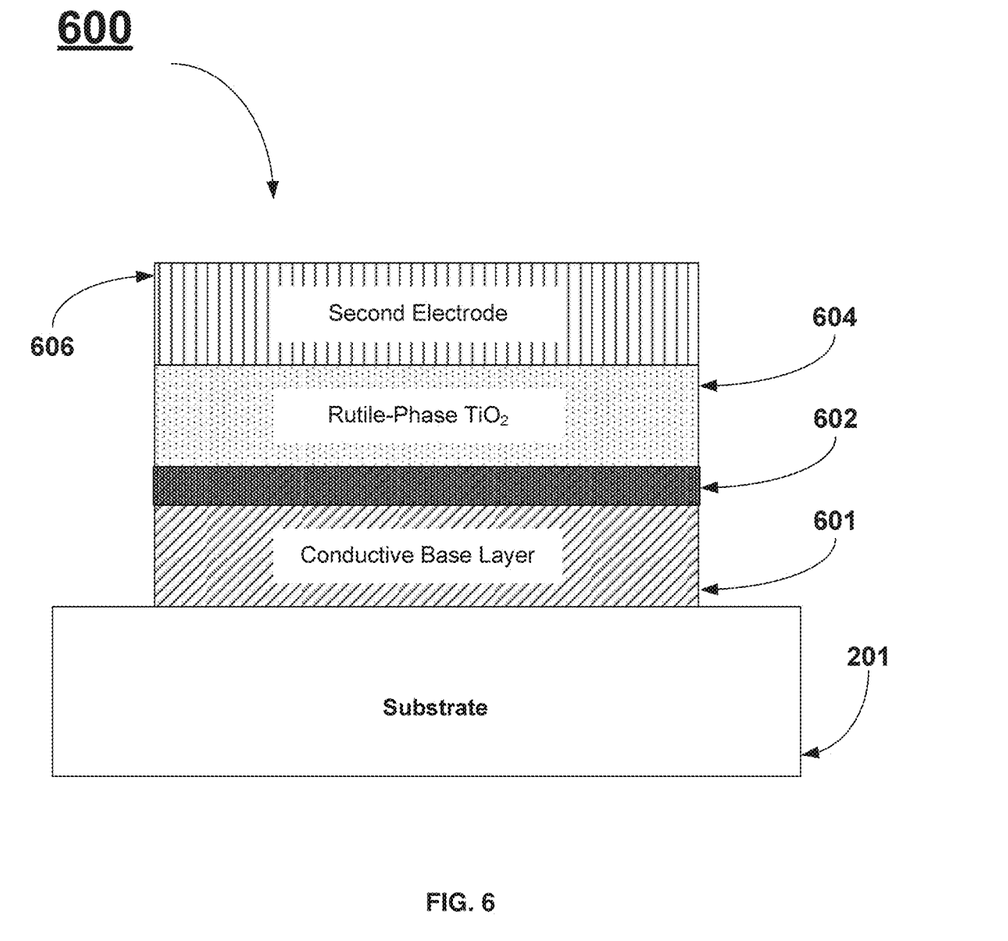
FIG. 6 illustrates a simplified cross-sectional view of a DRAM capacitor stack fabricated in accordance with some embodiments of the present invention.

FIG. 6 illustrates a specific example of a simple capacitor stack, 600, consistent with some embodiments of the present invention. In this illustration, only a thin layer of the conductive binary metal compound is formed on top of a previously deposited conductive base layer, 601, to form the first electrode. The base layer may be a metal or highly conductive material such as TiN, TaN, TiAlN, Al, Cu, W, WN or the like. Using the method as outlined in FIG. 1 and described above, thin first electrode layer, 602, is formed on base layer, 601. Generally, the substrate has already received several processing steps in the manufacture of a full DRAM device. In this example, thin first electrode layer, 602, comprises a $MoO_2$ material that also contains oxygen-rich components ($MoO_{2+x}$). The thin first electrode layer, 602, may have a thickness between about 0.5 nm and 5 nm. The goal is to maximize the amount of $MoO_2$ present in thin first electrode layer, 602, because it has a distorted rutile crystal structure and would serve as a good template to promote the growth of rutile-phase $TiO_2$ dielectrics in a later deposition step. The presence of oxygen-rich materials ($MoO_{2+x}$) is to be minimized because they generally do not promote the growth of the rutile-phase crystal structure of the $TiO_2$ dielectric material. It is desirable that the crystalline $MoO_2$ phase account for ≥40% of the first electrode.

In a variation of the capacitor stack as illustrated in FIG. 6, a thin first electrode layer, 602, may be formed in-situ from base layer, 601. In the case of $MoO_2$, for example, $Mo_2N$ may be deposited onto a substrate, 201, as a base layer, 601. Then, the surface of the $Mo_2N$ base layer, 601, may undergo an oxygen treatment (e.g., annealing in an oxygen enriched atmosphere, plasma treatment, ozone, etc.) so as to replace some of the nitrogen atoms of the $Mo_2N$ base layer material with oxygen atoms. This may result in a conversion of a thin layer of $Mo_2N$ to $MoO_2$.

In the next step, the substrate with base layer, 601, and thin first electrode layer, 602, comprising $MoO_2$ mixed with $MoO_{2+x}$ would then be annealed in a reducing atmosphere to reduce the concentration of the oxygen-rich components. Generally, the reducing atmosphere will comprise $H_2$, or $NH_3$ mixed with an inert gas. A specific example of a reducing atmosphere that is available commercially is forming gas wherein the $H_2$ concentration can range between about 1 and 25% mixed with $N_2$. The annealing in the reducing atmosphere may utilize either thermal energy, plasma energy, or RTA to activate the reducing atmosphere. The reducing atmosphere will crystallize the thin first electrode layer if there is an amorphous component and reduce the $MoO_{2+x}$ species to $MoO_2$.

In some embodiments of the present invention, a forming gas having a $H_2$ concentration of between approximately 1 to 10% when introduced at annealing temperatures between approximately 400 to 650° C. for a process time of 1 minute to several hours displays the chemical reducing properties required to reduce the concentration of oxygen-rich molybdenum oxides present in the thin first electrode, 602.

In the next step, dielectric layer, 604, would then be formed on the annealed base layer, 601, and thin first electrode layer, 602. In this example, a layer of $TiO_2$ that exists predominantly (>30%) in the rutile-phase is deposited as the dielectric layer, 604. The rutile-phase of $TiO_2$ grows preferentially over the anatase-phase due to the distorted rutile-phase crystal structure of the underlying predominantly $MoO_2$ electrode material. The $TiO_2$ layer generally has a thickness between 5 nm and 20 nm and exhibits a k value of >40. Optionally, the dielectric layer may now receive a PDA treatment.

In the next step, the second electrode layer, 606, is formed on dielectric layer, 604. The second electrode layer may be a binary metal compound material as described above, a metal, or a combination thereof. Optionally, the DRAM capacitor stack may now receive a PMA treatment. The remaining full DRAM device (not shown) would then be manufactured using well known techniques.

Figure 7:
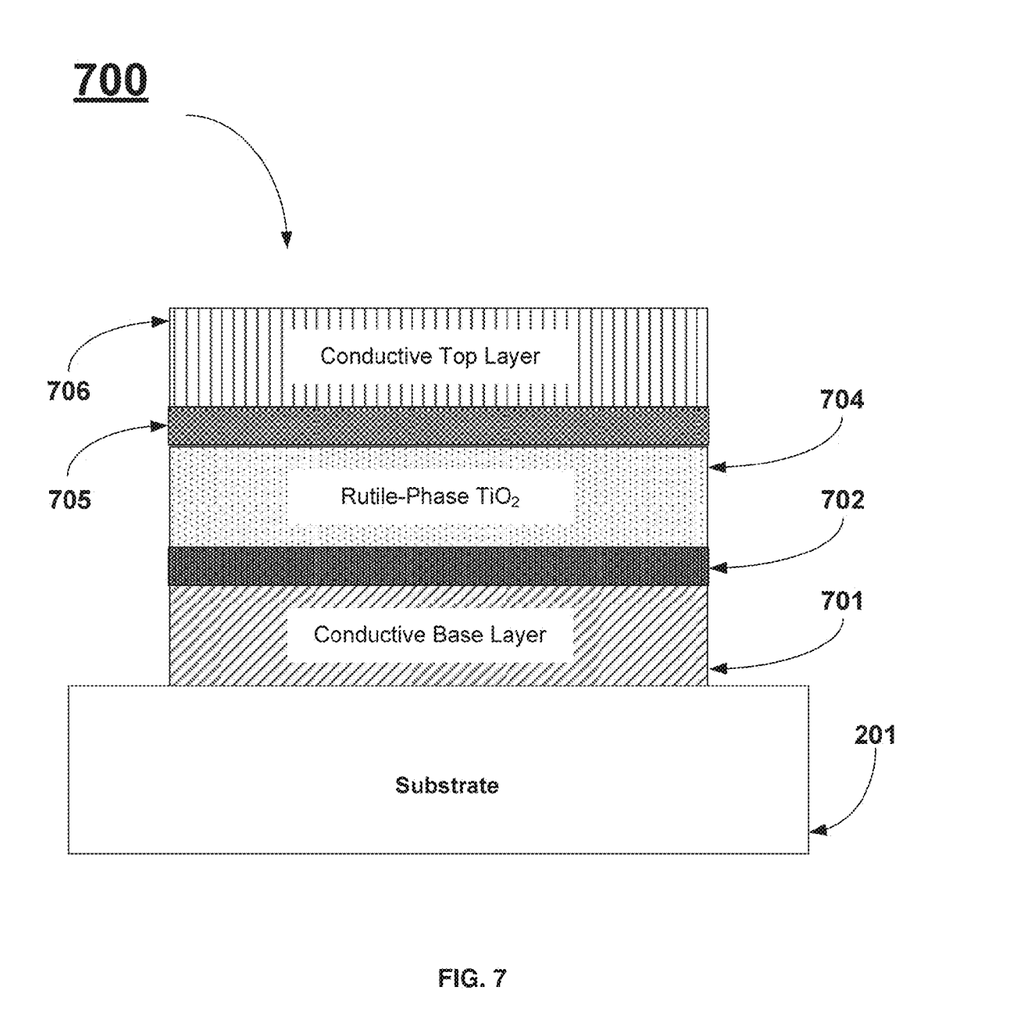
FIG. 7 illustrates a simplified cross-sectional view of a DRAM capacitor stack fabricated in accordance with some embodiments of the present invention.

FIG. 7 illustrates an alternative embodiment for the second electrode. The steps for forming the base layer, 701, the thin first electrode layer, 702, and the dielectric layer, 704, are the same as previously described. In this example, a thin layer of the conductive binary compound that is part of the second electrode layer, 705, is formed on dielectric layer, 704. In this example, thin second electrode layer, 705, comprises a conductive metal oxide. Examples of the conductive metal oxides include molybdenum oxide, tungsten oxide, ruthenium oxide, rhenium oxide, chromium oxide, rhodium oxide, iridium oxide, manganese oxide, tin oxide, cobalt oxide, or nickel oxide. In this example, thin second electrode layer, 705, comprises a $MoO_2$ material. The thin second electrode layer, 705, may have a thickness between about 0.5 nm and 5 nm. The goal is to maximize the amount of $MoO_2$ present in thin first electrode layer, 705, because it is highly conductive. The thin second electrode layer, 705, may then be annealed in an atmosphere where the $O_2$ content is between about 5% and about 10%. This anneal serves to crystallize the thin second electrode layer, 705, while not introducing a high concentration of $MoO_{2+x}$ species that would degrade the performance of the device. Additionally, the $O_2$ in the annealing step prevents the underlying dielectric layer from losing oxygen and increasing the number of oxygen vacancies ($V_{ox}$).

In the next step, a highly conductive top layer, 706, is formed on thin second electrode layer, 705. The top layer may be a metal or highly conductive material such as TiN, TaN, TiAlN, Al, Cu, W, WN or the like. The purpose of the top layer is to increase the overall conductivity of the second electrode of the capacitor.

The methods disclosed above may be used in the manufacture of a semiconductor device. The device will comprise a plurality of memory cells. Each memory cell will comprise at least one capacitor. Each capacitor will comprise a DRAM capacitor stack fabricated using the above described methods. For example, a DRAM capacitor stack fabricated in accordance with the present invention using a $TiO_2$ dielectric layer with a k value of 40 and a physical thickness of 5-20 nm will have an EOT of less than 0.8 nm (from Eqn. 2 above), while providing adequate charge retention characteristics. Moreover, the conductive metal oxide (e.g., $MoO_2$) based first electrodes of the present invention may have a work function greater than 5.1 eV leading to reduced leakage current. Additionally, a DRAM capacitor stack fabricated using the above described methods of the present invention and having a physical thickness of less than 20 nm is achievable via ALD, PE-ALD, AVD, CVD, PECVD, or PVD.

Although various embodiments that incorporate the teachings of the present invention have been shown and described in detail herein, those skilled in the art can readily devise many other varied embodiments that still incorporate these teachings.

What is claimed:

1. A semiconductor layer stack comprising:
    a first electrode layer formed on a substrate,
        the first electrode layer comprising $MoO_2$ and oxygen-rich $MoO_{2+x}$,
        wherein x is greater than 0,
        wherein the $MoO_2$ has a distorted rutile structure,
        wherein the amount of the $MoO_2$ in the first electrode is at least about 40% of total materials in the first electrode layer;
    a dielectric layer formed on the first electrode layer and directly interfacing the first electrode layer,
        the dielectric layer comprises titanium oxide doped with aluminum, the dielectric layer having a rutile phase,
        wherein the $MoO_7$ of the first electrode layer serves as a template for the rutile phase of the titanium oxide doped with aluminum; and
    a second electrode layer formed on the dielectric layer.

2. The semiconductor layer stack of claim 1, wherein the dielectric layer is titanium dioxide, wherein at least about 30% of the titanium dioxide is present in the rutile crystalline phase.

3. The semiconductor layer stack of claim 1, wherein the second electrode layer comprises one of a metal, a conductive metal oxide, a conductive metal nitride, a conductive metal silicide, or mixtures thereof.

4. The semiconductor layer stack of claim 1, wherein the dielectric layer has a thickness of between about 5 nm and 20 nm.

5. The semiconductor layer stack of claim 1, wherein the dielectric layer is a nanolaminate structure.

6. The semiconductor layer stack of claim 1, wherein the second electrode comprises molybdenum oxide.

7. The semiconductor layer stack of claim 6, wherein the second electrode further comprises oxygen-rich $MoO_{2+x}$.

8. The semiconductor layer stack of claim 1, wherein the first electrode has a work function greater than 5.1 eV.

9. The semiconductor layer stack of claim 1, wherein the first electrode layer has a thickness of between about 0.5 nm and 5 nm.

* * * * *